(12) United States Patent
Wang

(10) Patent No.: US 12,010,897 B2
(45) Date of Patent: Jun. 11, 2024

(54) FOLDABLE DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Fang Wang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/261,766

(22) PCT Filed: Oct. 20, 2020

(86) PCT No.: PCT/CN2020/122104
§ 371 (c)(1),
(2) Date: Mar. 13, 2023

(87) PCT Pub. No.: WO2022/000866
PCT Pub. Date: Jan. 6, 2022

(65) Prior Publication Data
US 2023/0209971 A1 Jun. 29, 2023

(30) Foreign Application Priority Data
Jun. 28, 2020 (CN) .......... 202010594105.X

(51) Int. Cl.
*H10K 59/80* (2023.01)
*G02B 5/30* (2006.01)
*G06F 3/041* (2006.01)
*H04M 1/02* (2006.01)
*H10K 59/12* (2023.01)
(Continued)

(52) U.S. Cl.
CPC .......... *H10K 59/80* (2023.02); *G02B 5/3016* (2013.01); *G06F 3/041* (2013.01); *H04M 1/0268* (2013.01); *H10K 77/111* (2023.02); *G06F 2203/04102* (2013.01); *H10K 59/12* (2023.02); *H10K 2102/311* (2023.02)

(58) Field of Classification Search
None
See application file for complete search history.

(56) References Cited

U.S. PATENT DOCUMENTS

| 2014/0333884 | A1* | 11/2014 | Lee ................ G02F 1/133377 438/30 |
| 2017/0025634 | A1 | 1/2017 | Jeong |
| 2017/0170417 | A1 | 6/2017 | Myung et al. |

(Continued)

FOREIGN PATENT DOCUMENTS

| CN | 106252378 A | 12/2016 |
| CN | 106373490 A | 2/2017 |

(Continued)

*Primary Examiner* — Richard H Kim

(57) ABSTRACT

Embodiments of the present invention provide a foldable display panel, comprising a display area. The display area is provided with a plurality of foldable areas, and a metal supporting layer is provided with a hollow pattern in the foldable areas. A material of the metal supporting layer is SUS stainless steel.

18 Claims, 4 Drawing Sheets

(51) Int. Cl.
*H10K 77/10* (2023.01)
*H10K 102/00* (2023.01)

(56) References Cited

U.S. PATENT DOCUMENTS

| | | | |
|---|---|---|---|
| 2019/0141843 A1* | 5/2019 | Park | H10K 50/841 |
| 2021/0041601 A1* | 2/2021 | Oh | G06F 1/1609 |
| 2021/0132275 A1* | 5/2021 | Beon | G02B 5/3016 |

FOREIGN PATENT DOCUMENTS

| | | |
|---|---|---|
| CN | 108172127 A | 6/2018 |
| CN | 109360499 A | 2/2019 |
| CN | 109727538 A | 5/2019 |
| CN | 110232869 A | 9/2019 |
| CN | 110336904 A | 10/2019 |
| CN | 110767098 A | 2/2020 |
| CN | 111627337 A | 9/2020 |
| JP | 2011064976 A | 3/2011 |
| KR | 20170131814 A | 11/2017 |

\* cited by examiner

FOLDABLE DISPLAY PANEL

FIELD OF INVENTION

The present invention relates to the field of foldable display technology, in particular, to a foldable display panel.

BACKGROUND OF INVENTION

As a flexible display, organic light emitting diode (OLED) display modules have unique bending and folding characteristics, and are thus prepared into various forms of foldable display devices, which are convenient to carry and store, and have received extensive attention from the market.

At present, flexible display panels usually use forms of an inwardly folding screen, an outwardly folding screen, or single-roller curling screen, so as to convert a size of the screen. Although the outwardly folding screen can still be used as a mobile phone after being folded, the screen is exposed too much, which increases a risk of impact failure. Although the inwardly folding screen protects the display module well, it makes a folded mobile terminal lose its application function. Adding a stainless steel supporting layer on a back of the flexible display panel as an overall support can meet the outwardly folding requirements; however, a radius of the inwardly folding area is much smaller than a radius of the outwardly folding area, thus stress is greater at the former. Moreover, the stainless steel supporting layer in the inwardly folding area is prone to arching and wrinkling after being flattened, and its ability to recover is poor. Cracks of the screen in the inwardly folding area will be enlarged due to an increase of a rebound force, further causing display abnormalities in the foldable OLED display panels.

In summary, it is necessary to provide a new foldable display panel to solve the above technical problems that after the flexible display panel is folded inwardly and flattened, the stainless steel supporting layer is prone to arching and wrinkling, and has a poor ability to recover.

SUMMARY OF INVENTION

Technical Problems

The embodiments of the present invention provide a foldable display panel, which can solve the problem below: a bi-foldable flexible display panel in the prior art comprises both an inwardly folding area and an outwardly folding area. Since the supporting layer in the inwardly folding area is affected by a large bending stress, it is prone to arching and wrinkling, which increase the risk of cracking of the display screen in the inwardly folding area, and further cause display abnormalities in the foldable OLED display panel.

SOLUTION TO PROBLEMS

Technical Solutions

To solve the above problems, the technical solutions provided by the present invention are as follows:

The embodiments of the present invention provide a foldable display panel, comprising a first display area, a second display area, a third display area, an inwardly folding area defined between the first display area and the second display area, and an outwardly folding area defined between the second display area and the third display area, wherein the foldable display panel further comprises a metal supporting layer, a display module disposed on a surface of the metal supporting layer, a touch layer disposed on a surface of the display module, and a polarizing cover layer disposed on a surface of the touch layer, wherein the metal supporting layer is provided with a complete SUS stainless steel layer in the first display area, the second display area, the third display area and the outwardly folding area, and the metal supporting layer is provided with an SUS stainless steel layer with a hollow pattern in the inwardly folding area; wherein the polarizing cover layer comprises a polarizing layer and a cover layer attached to each other, the polarizing layer is a liquid crystal layer and/or a polyvinyl alcohol film, and the cover layer is an organic and inorganic laminated layer.

According to a preferred embodiment of the present invention, the inwardly folding area is defined on a bending axis of the first display area and the second display area, and connects the first display area to the second display area.

According to a preferred embodiment of the present invention, the hollow pattern is a complete cut-out, and the cut-out is the same in shape and size as the inwardly folding area, and the metal supporting layer has a segmented structure.

According to a preferred embodiment of the present invention, the hollow pattern is separately arranged in parallel with or perpendicular to the bending axis, and the metal supporting layer is an integrated grid structure.

According to a preferred embodiment of the present invention, the hollow pattern comprises one or more of a rectangle, a parallelogram, or a trapezoid, and a long side of the hollow pattern is parallel to the bending axis.

According to a preferred embodiment of the present invention, angles between the outwardly folding area and the inwardly folding area are greater than 0 degrees, and less than or equal to 90 degrees.

According to a preferred embodiment of the present invention, a thickness of the metal supporting layer is in the range of 10 um to 30 um.

According to a preferred embodiment of the present invention, a fan-out area is disposed on an edge of the display area, a driving circuit is disposed in the fan-out area, a protection layer is disposed on a surface of the driving circuit, and the protection layer and the metal supporting layer are made of a same material and provided in a same layer.

According to a preferred embodiment of the present invention, the display module is an OLED display module or a mini-LED display module, a stress buffer layer is disposed between the display module and the metal supporting layer, and the stress buffer layer is made of foam or rubber.

According to a preferred embodiment of the present invention, the display module is an OLED display module, the OLED display module comprises a flexible substrate, a driving circuit layer disposed on a surface of the flexible substrate, a functional layer disposed on a surface of the driving circuit layer, and a packaging layer disposed on a surface of a light emitting layer, the rigidity of the metal supporting layer is greater than the rigidity of the flexible substrate.

The embodiments of the present invention further provide a foldable display panel, comprising a first display area, a second display area, a third display area, an inwardly folding area defined between the first display area and the second display area, and an outwardly folding area defined between the second display area and the third display area, wherein the foldable display panel further comprises a metal supporting layer, a display module disposed on a surface of the metal supporting layer, a touch layer disposed on a surface of the display module, and a polarizing cover layer disposed on a surface of the touch layer, wherein the metal supporting layer is provided with a complete SUS stainless steel layer in the first display area, the second display area, the third display area and the outwardly folding area, and the metal supporting layer is provided with an SUS stainless steel layer with a hollow pattern in the inwardly folding area.

According to a preferred embodiment of the present invention, the inwardly folding area is defined on a bending axis of the first display area and the second display area, and connects the first display area to the second display area.

According to a preferred embodiment of the present invention, the hollow pattern is a complete cut-out, and the cut-out is the same in shape and size as the inwardly folding area, and the metal supporting layer has a segmented structure.

According to a preferred embodiment of the present invention, the hollow pattern is separately arranged in parallel with or perpendicular to the bending axis, and the metal supporting layer is an integrated grid structure.

According to a preferred embodiment of the present invention, the hollow pattern comprises one or more of a rectangle, a parallelogram, or a trapezoid, and a long side of the hollow pattern is parallel to the bending axis.

According to a preferred embodiment of the present invention, angles between the outwardly folding area and the inwardly folding area are greater than 0 degrees, and less than or equal to 90 degrees.

According to a preferred embodiment of the present invention, a thickness of the metal supporting layer is in the range of 10 um to 30 um.

According to a preferred embodiment of the present invention, a fan-out area is disposed on an edge of the display area, a driving circuit is disposed in the fan-out area, a protection layer is disposed on a surface of the driving circuit, and the protection layer and the metal supporting layer are made of a same material and provided in a same layer.

According to a preferred embodiment of the present invention, the display module is an OLED display module or a mini-LED display module, a stress buffer layer is disposed between the display module and the metal supporting layer, and the stress buffer layer is made of foam or rubber.

According to a preferred embodiment of the present invention, the display module is an OLED display module, the OLED display module comprises a flexible substrate, a driving circuit layer disposed on a surface of the flexible substrate, a functional layer disposed on a surface of the driving circuit layer, and a packaging layer disposed on a surface of a light emitting layer, the rigidity of the metal supporting layer is greater than the rigidity of the flexible substrate.

BENEFICIAL EFFECTS OF THE INVENTION

Beneficial Effects

The embodiments of the present invention provide a foldable display panel. The foldable display panel in the present invention comprises a metal supporting layer, a display module disposed on a surface of the metal supporting layer, a touch layer disposed on a surface of the display module, and a polarizing cover layer disposed on a surface of the touch layer, wherein the foldable display panel comprises a display area, the display area is provided with a plurality of foldable areas, and the metal supporting layer is provided with a hollow pattern in the foldable areas; the material of the metal supporting layer is SUS stainless steel, and the thickness of the SUS stainless steel is in the range of 10 um to 30 um to meet the supporting function of the foldable display panel. The hollow pattern can effectively prevent folding stress concentration or unevenness, so that the bending stress of the entire structure is small during bending, and the risk of cracking of the films of the folded display panel is reduced, thereby improving the flexibility and stability of the foldable display panel.

BRIEF DESCRIPTION OF THE DRAWINGS

Description of Drawings

In order to explain the technical solutions in the embodiments or the prior art more clearly, the following will introduce briefly the drawings used in the description of the embodiments or the prior art. Obviously, the drawings in the following description are merely several embodiments of the present invention. For those skilled in the art, other drawings can be obtained based on these drawings without creative work.

Figure 1:
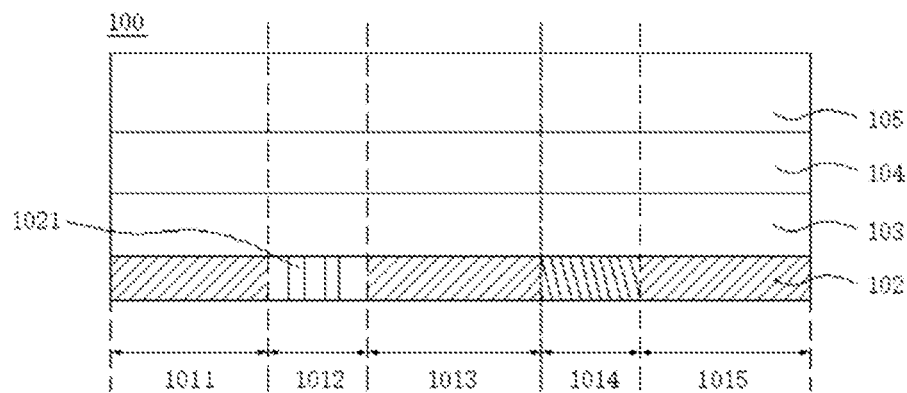

FIG. 1 is a schematic view of a film structure of a foldable display panel according to an embodiment of the present invention.

Figure 2:
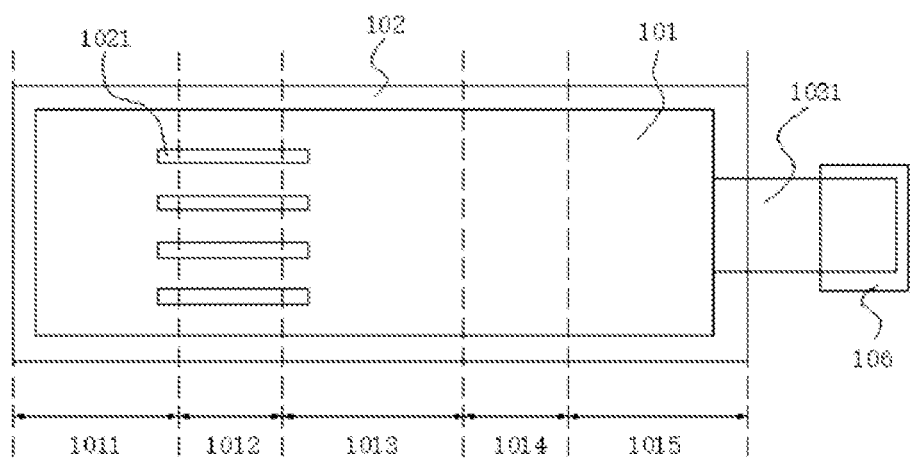

FIG. 2 is a schematic top view of a foldable display panel according to an embodiment of the present invention.

Figure 3:
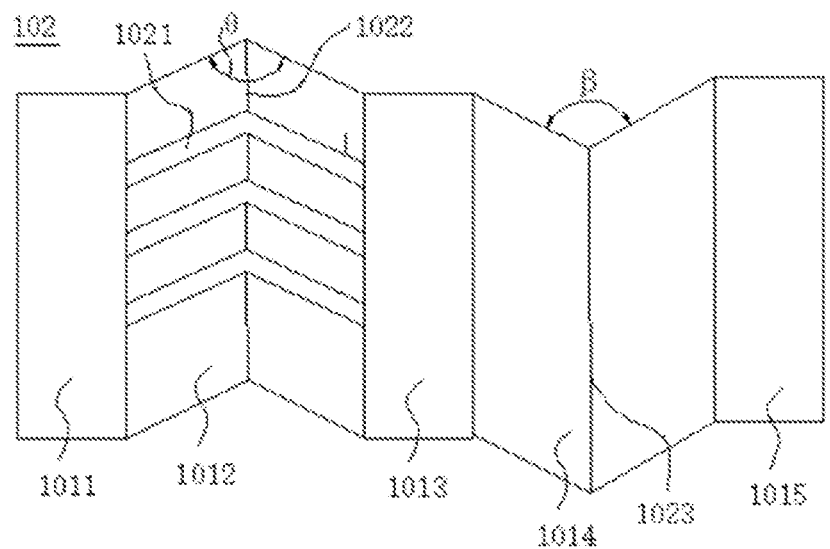

FIG. 3 is a schematic view of a bending structure of a metal supporting layer according to an embodiment of the present invention.

Figure 4:
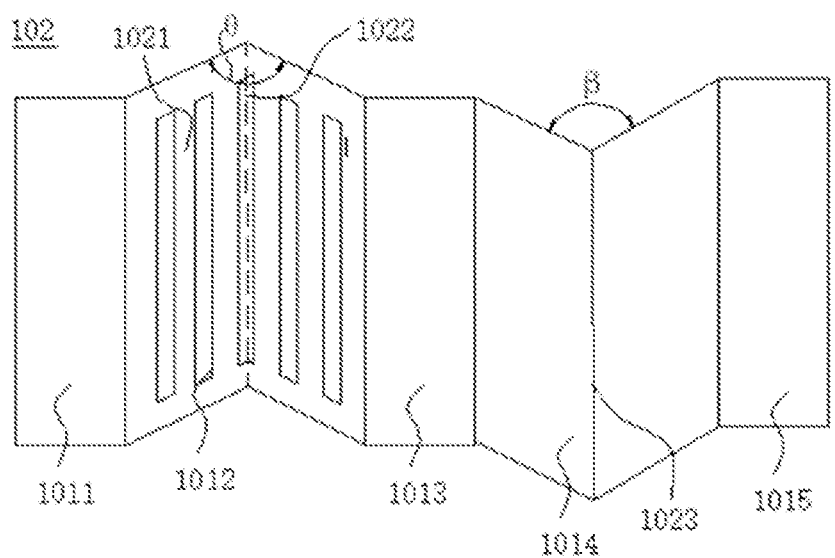

FIG. 4 is a schematic view of a bending structure of another metal supporting layer according to an embodiment of the present invention.

Figure 5:
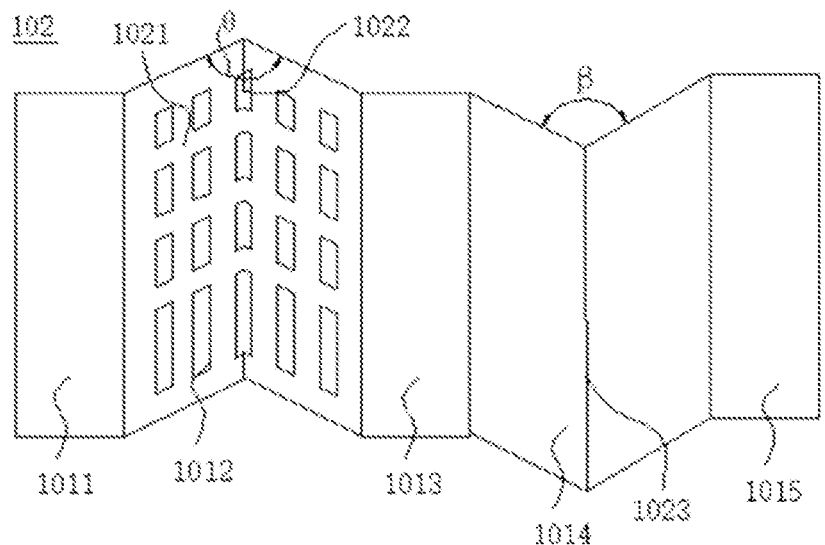

FIG. 5 is a schematic view of a bending structure of yet another metal supporting layer according to an embodiment of the present invention.

Figure 6:
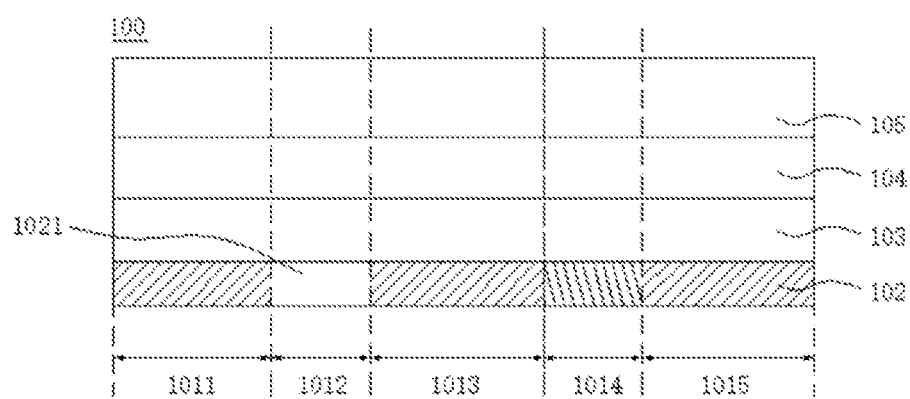

FIG. 6 is a schematic view of a film structure of another foldable display panel according to an embodiment of the present invention.

Figure 7:
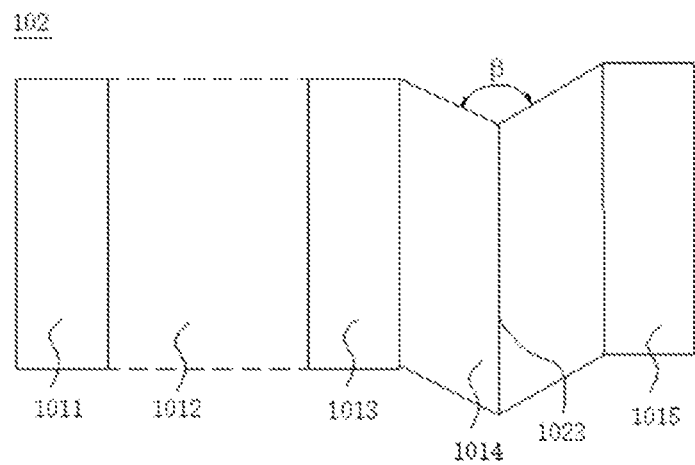

FIG. 7 is a schematic view of a bending structure of yet another metal supporting layer according to an embodiment of the present invention.

DETAILED DESCRIPTION OF EMBODIMENTS

The following description of every embodiment with reference to the accompanying drawings is used to exemplify a specific embodiment which may be carried out in the present invention. The directional terms mentioned herein, such as "Up", "Down", "Front", "Back", "Left", "Right", "Inner", "Outer", "Side", etc., are for referring to the directions in the drawings. Therefore, the used directional terms are intended to illustrate, but not to limit, the present invention. In the drawings, units with similar structures are indicated by same reference numeral. The dashed lines in the drawings indicate portions that do not exist in the structure, and only illustrate the shape and position of the structure.

The present invention directs to the problem below: a bi-foldable flexible display panel in the prior art comprises both an inwardly folding area and an outwardly folding area. Since the supporting layer in the inwardly folding area is affected by a large bending stress, it is prone to arching and wrinkling, which increase the risk of cracking of the display screen in the inwardly folding area, and further cause display abnormalities in the foldable OLED display panel. The present invention can solve the above defects.

As shown in FIGS. 1 and 2, an embodiment of the present invention provides a foldable display panel 100, the foldable display panel 100 comprises a first display area 1011, a second display area 1013, a third display area 1015, an inwardly folding area 1012 defined between the first display area 1011 and the second display area 1013, and an outwardly folding area 1014 defined between the second display area 1013 and the third display area 1015. Since the foldable display panel 100 is provided with a plurality of foldable areas, it is convenient to fold the large-sized display panel 100 into a reduced size or roll into a cylindrical shape, which is convenient to carry and store, and improves the user's operating experience. In the embodiment, angles between the inwardly folding area 1012 and the outwardly folding area 1014 are greater than 0 degrees and less than or equal to 90 degrees. The bending radius of the inwardly folding area 1012 is preferably in the range of 0.1 mm to 0.2 mm. The bending radius of the outwardly folding area 1014 is preferably in the range of 0.2 mm to 0.5 mm. The bending radius of the inwardly bending area 1012 is smaller than that of the outwardly bending area 1014. During the bending process, the stress to be borne is large. If the stress concentration or unevenness cannot be reduced in time, the film in the inwardly folding area 1012 may crack, which affects the display quality of the foldable display panel 100.

Specifically, as shown in FIG. 1, the foldable display panel 100 further comprises a metal supporting layer 102, a display module 103 disposed on a surface of the metal supporting layer 102, a touch layer 104 disposed on a surface of the display module 103, and a polarizing cover layer 105 disposed on a surface of the touch layer 104. The metal supporting layer 102 is provided with a complete SUS stainless steel layer in the first display area 1011, the second display area 1013, the third display area 1015, and the outwardly folding area 1014, and the metal supporting layer 102 is provided with an SUS stainless steel layer with a hollow pattern in the inwardly folding area 1012, which can meet the inwardly folding requirements and protect the display module. The hollow pattern 1021 is separately arranged in parallel with or perpendicular to a bending axis, and the metal supporting layer 102 is an integrated grid structure. The hollow pattern 1021 comprises one or more of a rectangle, a parallelogram, or a trapezoid, and a long side of the hollow pattern 1021 is parallel to the bending axis. The hollow pattern 1021 can effectively prevent stress concentration or unevenness in the inwardly folding area 1012, so that the bending stress of the entire structure is small during bending, and the risk of film cracking of the foldable display panel 100 is reduced, thereby improving the flexibility and stability of the foldable display panel 100. Moreover, a stress buffer layer (not shown) is disposed between the display module 103 and the metal supporting layer 102. The stress buffer layer is made of foam or rubber, which can further prevent stress concentration or unevenness, so as to make the bending stress of the entire structure smaller during bending.

The display module 103 is an OLED display module or a mini-LED display module. Taking the OLED display module as an example, the display module 103 comprises a flexible substrate, a driving circuit layer, a light emitting functional layer, and a packaging layer. The driving circuit layer comprises a TFT layer disposed on a surface of the flexible substrate. The flexible substrate comprises a first organic layer and an inorganic layer laminated in sequence. The first organic layer is a full-surface film, and the inorganic layer is a patterned structure. The full-surface film refers to a whole film which is uniform and seamless. The patterned structure can be a concave-convex structure with intervals, or in other words, gaps are provided between the first organic layer and the inorganic layer. When deformation occurs due to bending, the patterned structure can release the bending stress and reduce the stress on the inorganic layer, thereby preventing the inorganic layer from being broken or peeled from the first organic layer, so as to enhance the bendability of the flexible substrate and prolong the service life of the flexible substrate. The rigidity of the flexible substrate is less than the rigidity of the metal supporting layer 102. The driving circuit layer is disposed on a surface of the flexible substrate, and comprises a buffer layer, a driving layer, and an ITO layer laminated from bottom to top. The buffer layer is formed on a surface of the flexible substrate. The driving layer is formed on a surface of the buffer layer, and comprises a plurality of driving thin film transistors. The driving thin film transistor comprises at least a gate, a gate insulating layer, an active layer, and a source and drain layer. The gate insulating layer is formed on the gate layer, the active layer is formed on the gate insulating layer, and the active layer is insulated from the gate layer. The source and drain layer is arranged on both sides of the active layer. The source and drain layer comprises a source electrode and a drain electrode. The source electrode and the drain electrode are electrically connected to a corresponding position of the active layer, respectively. The light emitting functional layer is disposed on a surface of the driving circuit layer. The light emitting functional layer is a single-layer device structure, a double-layer device structure, a three-layer device structure, or a multi-layer device structure. Taking the three-layer device structure as an example, the light emitting functional layer comprises an anode, a hole transport layer, a light emitting layer, an electron transport layer, and a cathode. The packaging layer is generally an inorganic/organic/inorganic multilayer laminated structure, and the packaging layer is disposed on a surface of the light emitting functional layer to protect the light emitting device in the light emitting functional layer from water vapor erosion, thereby extending the display life of the display module.

The flexible touch layer 104 is disposed above the flexible display module 103. The polarizing cover layer 105 is disposed above the touch layer, and comprises a polarizing layer and a cover layer attached to each other, the polarizing layer is a liquid crystal layer and/or a polyvinyl alcohol film, and the cover layer is generally an organic and inorganic laminated layer.

As shown in FIG. 2, the display area 101 comprises a first display area 1011, an inwardly folding area 1012, a second display area 1013, an outwardly folding area 1014, and a third display area 1015. The metal supporting layer 102 is defined on the back of the display area 101. The metal supporting layer 102 is provided with a hollow pattern 1021 corresponding to the inwardly folding area 1012. The hollow pattern 1021 is preferably one or more of a rectangle, a parallelogram or a trapezoid, and is separately arranged perpendicular to a bending axis. The metal supporting layer 102 is an integrated grid structure.

An edge of the display area 101 is provided with a fan-out area 1031, the fan-out area 1031 can be bent to the back of the display area 101. The fan-out area 1031 is provided with a driving circuit, a surface of the driving circuit is provided with a protection layer 106, and the protection layer 106 and the metal supporting layer 102 are made of a same material and provided in a same layer.

As shown in FIG. 3, an embodiment of the present invention provides a schematic view of a bending structure of a metal supporting layer 102. The metal supporting layer 102 is provided with a complete SUS stainless steel layer in the first display area 1011, the second display area 1013, the third display area 1015, and the outwardly folding area 1014, and the metal supporting layer 102 is provided with an SUS stainless steel layer with a hollow pattern in the inwardly folding area 1012. The preset bending angle of the inwardly folding area 1012 is θ, and the preset bending angle of the outwardly folding area 1014 is β, where 0°≤α≤90°, 0°≤β≤90°. The hollow pattern 1021 is separately arranged perpendicular to a bending axis 1022, and the metal supporting layer 102 is an integrated grid structure. The hollow pattern 1021 comprises one or more of a rectangle, a parallelogram, or a trapezoid. The hollow pattern 1021 can effectively prevent stress concentration or unevenness in the inwardly folding area 1012, so that the bending stress of the entire structure is small during bending, and the risk of film cracking of the folded display panel 100 is reduced, thereby improving the flexibility and stability of the foldable display panel 100.

As shown in FIG. 4, an embodiment of the present invention provides a schematic view of a bending structure of another metal supporting layer 102. The hollow pattern 1021 is separately arranged in parallel with the bending axis 1022, and a long side of the hollow pattern 1021 is parallel to the bending axis 1022. The metal supporting layer 102 is an integrated grid structure. The hollow pattern 1021 comprises one or more of a rectangle, a parallelogram, or a trapezoid. The hollow pattern 1021 can effectively prevent stress concentration or unevenness in the inwardly folding area 1012, so that the bending stress of the entire structure is small during bending, and the risk of film cracking of the folded display panel 100 is reduced, thereby improving the flexibility and stability of the foldable display panel 100. The other structures are similar to those in FIG. 3 and will not be repeated here.

As shown in FIG. 5, an embodiment of the present invention provides a schematic view of a bending structure of yet another metal supporting layer 102. The hollow pattern 1021 is evenly arranged along the two sides of the bending axis 1022, a long side of the hollow pattern 1021 is parallel to the bending axis 1022, and the metal supporting layer 102 is an integrated grid structure. The hollow pattern 1021 comprises one or more of a rectangle, a parallelogram, or a trapezoid. The hollow pattern 1021 can effectively prevent stress concentration or unevenness in the inwardly folding area 1012, so that the bending stress of the entire structure is small during bending, and the risk of film cracking of the folded display panel 100 is reduced, thereby improving the flexibility and stability of the foldable display panel 100. The other structures are similar to those in FIG. 3 and will not be repeated here.

As shown in FIG. 6, an embodiment of the present invention provides another foldable display panel 100. The metal supporting layer 102 is provided with a complete SUS stainless steel layer in the first display area 1011, the second display area 1013, the third display area 1015, and the outwardly folding area 1014, and the metal supporting layer 102 is provided with an entire hollow pattern in the inwardly folding area. The hollow pattern 1021 is a complete cut-out, and the cut-out is the same in shape and size as the inwardly folding area, and the metal supporting layer 102 has a segmented structure. The other structures are similar to those in FIG. 2 and will not be repeated here.

As shown in FIG. 7, an embodiment of the present invention provides a schematic view of a bending structure of yet another metal supporting layer 102. During the bending process, the inwardly folding area 1012 is not provided with a metal supporting layer 102, and thus the inwardly folding area 1012 does not suffer from the bending stress of the metal supporting layer 102, preventing arching and wrinkling, thereby improving the flexibility and stability of the foldable OLED display panels. The other structures are similar to those in FIG. 3 and will not be repeated here.

The embodiments of the present invention provide a foldable display panel. The foldable display panel in the present invention comprises a metal supporting layer, a display module disposed on a surface of the metal supporting layer, a touch layer disposed on a surface of the display module, and a polarizing cover layer disposed on a surface of the touch layer, wherein the foldable display panel comprises a display area, the display area is provided with a plurality of foldable areas, and the metal supporting layer is provided with a hollow pattern in a foldable area; the material of the metal supporting layer is SUS stainless steel, and the thickness of the SUS stainless steel is in the range of 10 um to 30 um to meet the supporting function of the foldable display panel. The hollow pattern can effectively prevent folding stress concentration or unevenness, so that the bending stress of the entire structure is small during bending, and the risk of cracking of the films of the folded display panel is reduced, thereby improving the flexibility and stability of the foldable display panel.

In summary, although the present invention has been disclosed in the above preferred embodiments, the above preferred embodiments do not intend to limit the present invention. Various modifications and changes may be made by ordinary person skilled in the art without departing from the spirit and scope of the present invention. Therefore, the scope of protection of the present invention is subject to the scope defined by the claims.

What is claimed is:

1. A foldable display panel, comprising a first display area, a second display area, a third display area, an inwardly folding area defined between the first display area and the second display area, and an outwardly folding area defined between the second display area and the third display area, wherein the foldable display panel further comprises a metal supporting layer, a display module disposed on a surface of the metal supporting layer, a touch layer disposed on a surface of the display module, and a polarizing cover layer disposed on a surface of the touch layer, wherein the metal supporting layer is provided with a complete SUS stainless steel layer in the first display area, the second display area, the third display area, and the outwardly folding area, and the metal supporting layer is provided with an SUS stainless steel layer with a hollow pattern in the inwardly folding area; and wherein the polarizing cover layer comprises a polarizing layer and a cover layer attached to each other, the polarizing layer is a liquid crystal layer and/or a polyvinyl alcohol film, and the cover layer is an organic and inorganic laminated layer, wherein a fan-out area is disposed on an edge of the display area, a driving circuit is disposed in the fan-out area, a protection layer is disposed on a surface of the driving circuit, and the protection layer and the metal supporting layer are made of a same material and provided in a same layer.

2. The foldable display panel as claimed in claim 1, wherein the inwardly folding area is defined on a bending axis of the first display area and the second display area, and connects the first display area to the second display area.

3. The foldable, display panel as claimed in claim 2, wherein the hollow pattern is a complete cut-out, and the cut-out is same in shape and size as the inwardly folding area, and the metal supporting layer has a segmented structure.

4. The foldable display panel as claimed in claim 2, wherein the hollow pattern is separately arranged in parallel with or perpendicular to the bending axis, and the metal supporting layer is an integrated grid structure.

5. The foldable display panel as claimed in claim 4, wherein the hollow pattern comprises one or more of a rectangle, a parallelogram, or a trapezoid, and a long side of the hollow pattern is parallel to the bending axis.

6. The foldable display panel as claimed in claim 1, wherein angles between the outwardly folding area and the inwardly folding area are greater than 0 degrees, and less than or equal to 90 degrees.

7. The foldable display panel as claimed in claim 1, wherein a thickness of the metal supporting layer is in the range of 10 um to 30 um.

8. The foldable display panel as claimed in claim 1, wherein the display module is an OLED display module or a mini-LED display module, a stress buffer layer is disposed between the display module and the metal supporting layer, and the stress buffer layer is made of foam or rubber.

9. The foldable display panel as claimed in claim 8, wherein the display module is the OLED display module, the OLED display module comprises a flexible substrate, a driving circuit layer disposed on a surface of the flexible substrate, a functional layer disposed on a surface of the driving circuit layer, and a packaging layer disposed on a surface of a light emitting layer, and a rigidity of the metal supporting layer is greater than a rigidity of the flexible substrate.

10. A foldable display panel, comprising a first display area, a second display area, a third display area, an inwardly folding area defined between the first display area and the second display area, and an outwardly folding area defined between the second display area and the third display area, wherein the foldable display panel further comprises a metal supporting layer, a display module disposed on a surface of the metal supporting layer, a touch layer disposed on a surface of the display module, and a polarizing cover layer disposed on a surface of the touch layer, wherein the metal supporting layer is provided with a complete SUS stainless steel layer in the first display area, the second display area, the third display area, and the outwardly folding area, and the metal supporting layer is provided with an SUS stainless steel layer with a hollow pattern in the inwardly folding area, wherein a fan-out area is disposed on an edge of the display area, a driving circuit is disposed in the fan-out area, a protection layer is disposed on a surface of the driving circuit, and the protective layer and the metal supporting layer are made of a same material and provided in a same layer.

11. The foldable display panel as claimed in claim 10, wherein the inwardly folding area is defined on a bending axis of the first display area and the second display area, and connects the first display area to the second display area.

12. The foldable display panel as claimed in claim 11, wherein the hollow pattern is a complete cut-out, and the cut-out is same in shape and size as the inwardly folding area, and the metal supporting layer has a segmented structure.

13. The foldable display panel as claimed in claim 11, wherein the hollow pattern is separately arranged in parallel with or perpendicular to the bending axis, and the metal supporting layer is an integrated grid structure.

14. The foldable display panel as claimed in claim 13, wherein the hollow pattern comprises one or more of a rectangle, a parallelogram, or a trapezoid, and a long side of the hollow pattern is parallel to the bending axis.

15. The foldable display panel as claimed in claim 10, wherein angles between the outwardly folding area and the inwardly folding area are greater than 0 degrees, and less than or equal to 90 degrees.

16. The foldable display panel as claimed in claim 10, wherein a thickness of the metal supporting layer is in the range of 10 um to 30 um.

17. The foldable display panel as claimed in claim 11, wherein the display module is an OLEO display module or a mini-LED display module, a stress buffer layer is disposed between the display module and the metal supporting layer, and the stress buffer layer is made of foam or rubber.

18. The foldable display panel as claimed in claim 17, wherein the display module is the OLED display module, the OLED display module comprises a flexible substrate, a driving circuit layer disposed on a surface of the flexible substrate, a functional layer disposed on a surface of the driving circuit layer, and a packaging layer disposed on a surface of a light emitting layer, and a rigidity of the metal supporting layer is greater than a rigidity of the flexible substrate.

* * * * *